United States Patent [19]

Takaishi

[11] Patent Number: 5,726,083
[45] Date of Patent: Mar. 10, 1998

[54] PROCESS OF FABRICATING DYNAMIC RANDOM ACCESS MEMORY DEVICE HAVING STORAGE CAPACITOR LOW IN CONTACT RESISTANCE AND SMALL IN LEAKAGE CURRENT THROUGH TANTALUM OXIDE FILM

[75] Inventor: Yoshihiro Takaishi, Tokyo, Japan

[73] Assignee: NEC Corporation, Tokyo, Japan

[21] Appl. No.: 562,224

[22] Filed: Nov. 28, 1995

[30] Foreign Application Priority Data

Nov. 29, 1994 [JP] Japan ............................ 6-294394

[51] Int. Cl.$^6$ ............................................. H01L 21/8238
[52] U.S. Cl. ................... 438/210; 438/240; 438/253; 438/256; 438/396; 438/399
[58] Field of Search ........................... 438/210, 239, 438/240, 253, 256, 396, 399

[56] References Cited

U.S. PATENT DOCUMENTS

| | | | |
|---|---|---|---|
| 5,302,549 | 4/1994 | Santangelo et al. | 437/188 |
| 5,346,843 | 9/1994 | Kuroda | 438/396 |
| 5,429,979 | 7/1995 | Lee et al. | 438/396 |
| 5,508,221 | 4/1996 | Kamiyama | 438/396 |
| 5,569,618 | 10/1996 | Matsubara | 438/396 |

*Primary Examiner*—Trung Dang
*Attorney, Agent, or Firm*—Sughrue, Mion, Zinn, Macpeak & Seas, PLLC

[57] ABSTRACT

When tantalum oxide is used for a dielectric film of a stacked type storage capacitor forming a memory cell together with a switching transistor, heat treatments are limited to 530 degrees centigrade in the stages after the deposition of the tantalum oxide, and leakage current across the tantalum oxide is drastically decreased.

10 Claims, 11 Drawing Sheets

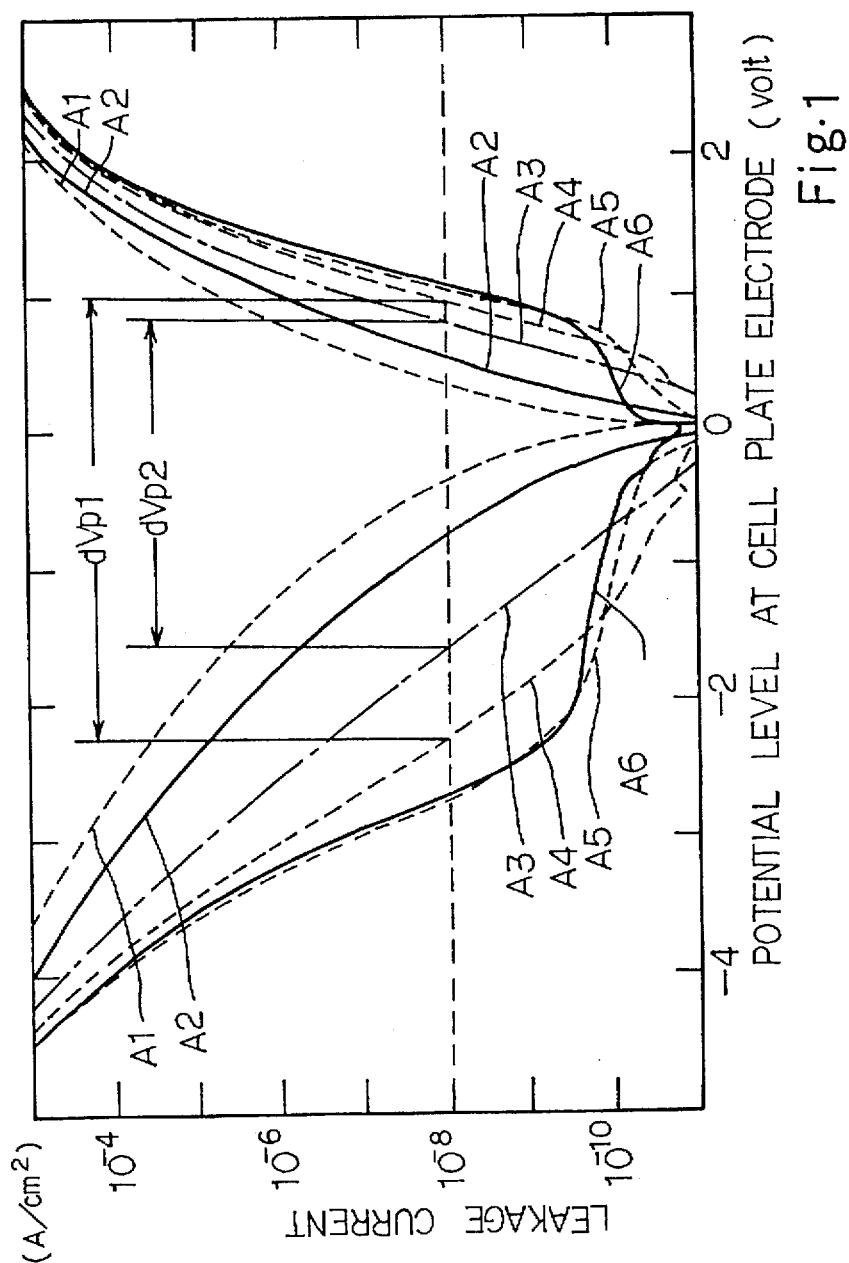

PROCESS OF FABRICATING DYNAMIC RANDOM ACCESS MEMORY DEVICE HAVING STORAGE CAPACITOR LOW IN CONTACT RESISTANCE AND SMALL IN LEAKAGE CURRENT THROUGH TANTALUM OXIDE FILM

FIELD OF THE INVENTION

This invention relates to a process of fabricating a dynamic random access memory cell and, more particularly, to a process of fabricating a dynamic random access memory cell having a storage capacitor with a tantalum oxide film low in contact resistance and small in leakage current through the tantalum oxide film.

DESCRIPTION OF THE RELATED ART

Miniaturization of circuit components has achieved ultra large scale integration. The dynamic random access memory device has decreased an occupation area assigned to each memory cell through the miniaturization, and presently results in a 64 mega-bit dynamic random access memory.

A storage capacitor is incorporated in a dynamic random access memory device, and the configuration of the storage capacitor has been improved so as to maintain the capacitance in spite of the reduction of the occupation area. However, the improvement of the configuration reaches the limit, and a new approach is required to develop the next generation, i.e., a 256 mega-bit dynamic random access memory device.

One of the approaches is to use a dielectric film with a large dielectric constant, and tantalum oxide is attractive to the new dielectric film.

The dynamic random access memory device of the next generation integrates a large number of circuit components, and peripheral circuits are required to decrease power consumption. For this reason, some 1 mega-bit dynamic random access memory device were equipped with peripheral circuits fabricated from complementary transistors, i.e., a series of a p-channel enhancement type field effect transistor and an n-channel enhancement type field effect transistor.

The present inventor had designed a dynamic random access memory device under 0.4 micron design rules and fabricated the dynamic random access memory device for studying the next generation. The dynamic random access memory device had a stacked type storage capacitor with the dielectric film of tantalum oxide and peripheral circuits implemented by the complementary transistors.

The dynamic random access memory device was fabricated as follows. First, p-type wells and n-type wells were formed on a surface portion of a p-type silicon substrate, and a field oxide layer was selectively grown so as to define active areas. Selected p-type wells were assigned to a memory cell array, and the remaining p-type wells and the n-type wells were used for peripheral circuits.

Gate oxide layers were grown to 10 nanometers thick on the active areas, and gate electrodes were patterned on the gate oxide layers. The gate electrodes were a polyside structure, i.e., laminated structure of a refractory metal silicide layer and a polysilicon layer. Word lines contained the gate electrodes over the active areas in the p-type wells assigned to the memory cell array.

A patterned photo-resist layer covered the p-type/n-type wells assigned to the peripheral circuits, and phosphorous was ion implanted into the exposed active areas at dose of $10^{13}$ cm$^{-2}$ under 30 KeV. The field oxide layer and the word lines served as a mask together with the patterned photo-resist layer. The phosphorous implanted into the exposed active areas formed n-type source/drain regions of n-channel enhancement type switching transistors of the dynamic random access memory cells. The patterned photo-resist layer was stripped off.

A photo-resist layer was patterned, and the patterned photo-resist layer covered the active areas assigned to the memory cell array and the active areas in the n-type wells. Using the patterned photo-resist layer, the gate electrodes and the field oxide layer as a mask, arsenic was ion implanted into the exposed active areas at dose of $10^{15}$ cm$^{-2}$ under 30 KeV. N-type source/drain regions were formed in the active areas assigned to the n-channel enhancement type field effect transistors for the peripheral circuits. The patterned photo-resist layer was stripped off.

A photo-resist layer was patterned again, and the patterned photo-resist layer covered the p-type wells. Using the photo-resist layer, the gate electrodes and the field oxide layer as a mask, boron was ion implanted into the exposed active areas assigned to the p-type enhancement type field effect transistors at dose of $10^{15}$ cm$^{-2}$ under 30 KeV. The boron formed p-type source/drain regions in the n-type wells for the n-channel enhancement type field effect transistors. The patterned photo-resist layer was stripped off.

The implanted impurities were activated through a heat treatment, and finally formed p-n junctions around 0.15 microns in depth.

Silicon oxide was deposited to 300 nanometers thick over the entire surface of the structure, and formed a first inter-level insulating layer.

A photo-resist layer was patterned, and the patterned photo-resist layer exposed areas on the first inter-level insulating layer over the n-type drain regions of the n-channel enhancement type switching transistors. Using the patterned photo-resist layer as a mask, the first interlevel insulating layer was partially etched away, and bit contact holes reach the surfaces of the n-type drain regions. Each of the contact holes was 0.4 micron square.

Phosphorous was ion implanted through the bit contact holes into the contact areas of the n-type drain regions at dose of $10^{15}$ cm$^{-2}$. Bit lines were formed on the first inter-level insulating layer, and were held in contact through the bit contact holes with the n-type drain regions. The bit lines were the polyside structure, and were 200 nanometers thick.

Silicon oxide was deposited over the first interlevel insulating layer to 300 nanometers thick, and the first inter-level insulating layer was overlain by a second inter-level insulating layer of the silicon oxide.

A photo-resist layer was patterned so as to expose areas in the second inter-level insulating layer over the n-type source regions of the n-channel enhancement type switching transistors. Using the patterned photo-resist layer as a mask, the exposed areas of the second inter-level insulating layer and the first inter-level insulating layer thereunder were selectively etched away, and storage node contact holes were formed through the first and second inter-level insulating layers. Each of the storage node contact holes was 0.4 micron square, and reached the surface of the n-type source region.

Phosphorous was ion implanted through the storage node contact holes into the n-type source regions at dose of $10^{15}$ cm$^{-2}$. The n-type drain regions under the bit contact holes and the n-type source regions under the storage node contact holes still formed the p-n junctions around 0.15 micron in depth.

Storage node electrodes of 600 nanometer thick were patterned on the second inter-level insulating layer, and were respectively held in contact through the storage node contact holes with the n-type source regions of the n-channel enhancement type switching transistors. The storage node electrodes were formed in the polysilicon structure.

Subsequently, tantalum oxide was deposited to 100 nanometers thick by using a vapor phase deposition, and gaseous mixture of ethoxy tantalum, i.e., $Ta(OC_2H_5)_2$ and oxygen was supplied during the vapor phase deposition. Tantalum oxide was produced at 450 degrees centigrade, and formed a tantalum oxide film covering the storage node electrodes. The tantalum oxide film of 100 nanometers thick was equivalent to a silicon oxide film of 2.5 nanometers thick.

A titanium nitride film of 100 nanometers thick was deposited over the tantalum oxide film by using a reactive sputtering, and, thereafter, a tungsten silicide film of 100 nanometers thick was deposited over the titanium nitride film by using a sputtering. The tungsten silicide film, the titanium nitride film and the tantalum oxide film were successively patterned through etching techniques. As a result, the storage node electrodes were covered with dielectric layers, respectively, and cell plate electrodes were opposed through the dielectric layers to the storage node electrodes. Thus, the dynamic random access memory cells were fabricated over the active areas in the p-type wells.

Subsequently, boro-phosphosilicate glass was deposited to 650 nanometers thick over the entire surface by decomposing tetraethylorthosilicate abbreviated as TEOS, and the boro-phosphosilicate glass film served as a third inter-level insulating layer. Contact holes were formed in the first, second and third inter-level insulating layers, and were 0.4 micron square. The contact holes reached the n-type drain regions of the n-channel enhancement type field effect transistors and the p-type drain regions of the p-channel enhancement type field effect transistors.

Phosphorous was ion implanted through the contact holes into the n-type drain regions of the n-channel enhancement type field effect transistors at dose of $3 \times 10^{14}$ $cm^{-2}$ under 70 KeV, and boron fluoride, i.e., $BF_2$ was ion implanted through the other contact holes into the p-type drain regions of the p-channel enhancement type field effect transistors $3 \times 10^{15}$ $cm^{-2}$ under 70 KeV. The implanted impurities were activated through heat treatment at 850 degrees centigrade for 10 minutes.

A titanium layer and a titanium nitride layer were deposited over the entire surface, and covered the n-type drain regions and the p-type drain regions exposed to the contact holes. The silicon substrate was placed in nitrogen ambience, and the titanium was subjected to a rapid annealing at 690 degrees centigrade for 30 seconds. The titanium on the p-type/n-type drain regions was converted to titanium silicide films, and the titanium silicide films served as barrier metal layers over the shallow junctions.

If the titanium was converted to the titanium silicide at 800 degrees centigrade, the titanium silicide had C54 structure low in resistivity. The complementary transistors had the shallow junctions of 0.15 micron in depth, and the barrier metal layers were indispensable over the shallow junctions. The barrier metals of titanium silicide became low resistive C54 structure through the heat treatment around 800 degrees centigrade.

U.S. Pat. No. 5302549 discloses an annealing lower than 500 degrees centigrade. According to the U.S. Patent, contact holes are formed in an insulating layer, and an n-type impurity region is exposed to the contact holes. Arsenic is ion implanted at not greater than 30 KeV, and the n-type region is amorphized and enriched in dopant concentration. Titanium is deposited, and the amorphous region is covered with the titanium film. The titanium film on the amorphous region is annealed at lower than 500 degrees centigrade for less than 60 minutes. Then, the amorphous silicon region is recrystallized, and the implanted arsenic is activated. As a result, a metal-semiconductor ohmic contact is formed on the recrystallized n-type region. However, the U.S. Patent does not teach exact relation between different n-type impurities and the conditions of the ion-implantation, and a low-resistive contact is hardly formed on not only the n-type impurity region but also a p-type impurity region.

The contact holes were plugged with tungsten pieces, and aluminum was sputtered onto the third inter-level insulating layer. The aluminum layer was patterned into wirings, and the aluminum wirings were alloyed in forming gaseous mixture of hydrogen and nitrogen. The wirings of the aluminum alloy formed the n-channel enhancement type field effect transistors and the p-channel enhancement type field effect transistors into the complementary transistors of the peripheral circuits.

The present inventor evaluated the dynamic random access memory device. First, the present inventor measured contact leakage current of the n-type/p-type drain region of the complementary transistors, and estimated the contact resistance as follows. The present inventor prepared an n-type impurity region of 0.0272 $mm^2$, and the n-type impurity region was exposed to fifteen contact holes each 0.4 micron square through the same process as that described hereinbefore. 5 volts was applied through the 15000 contact holes coupled in parallel to the n-type impurity region, and measured the contact leakage current. The average contact leakage current was $1.5 \times 10$ pA, and the average resistance at each contact was $6 \times 10$ ohms.

Similarly, the present inventor prepared a p-type impurity region of 0.0272 $mm^2$, and the p-type impurity region was exposed to 15000 contact holes each 0.4 micron square. 5 volts were applied through the contact holes in parallel to the p-type impurity region, and measured the contact leakage current. The average contact leakage current was $3.4 \times 10$ pA, and the average contact resistance was $2.8 \times 10^2$ ohms.

The contact resistance on each of the p-type/n-type drain regions was lower than 1 kilo-ohm, and the average leakage current was small enough to form the peripheral circuits. The peripheral circuits were powered with 3.3. volts, and the present inventor concluded the complementary transistors fabricated through the above described process were available for the dynamic random access memory device.

The present inventor noticed that a large amount leakage current flowed between the storage node electrodes and the cell plate electrode. In detail, the positive power voltage Vcc supplied to the memory cell array was 2.5 volts, and potential applied between the storage node electrode and the cell plate electrode was ±Vcc/2. When the leakage current of the storage capacitor was more than $10^{-8}$ $A/cm^{-2}$, the dynamic random access memory cell could not provide a data storage, and the leakage current of $10^{-8}$ $A/cm^{-2}$ was hereinbelow referred to as "critical leakage current".

The present inventor evaluated the storage capacitor as follows. First, the present inventor measured the potential difference between two potential levels on cell plate electrode (which was hereinbelow referred to as "cell plate level") at the critical leakage current. If the potential difference was larger than the positive power voltage Vcc, the storage capacitor was theoretically available for the dynamic random access memory cell. In an actual usage, a margin should b taken into account. In this instance, the positive power voltage Vcc was 2.5 volts, and 0.5 volt would be appropriate for the margin.

The present inventor measured the potential difference of the storage capacitor fabricated through the above described process. The potential difference was 0.7 volts at $10^{-2}$ A/cm$^2$ and 1.6 volts at $10^{-6}$ A/cm$^2$. This meant that the leakage current was too large to store a data bit under the potential difference of 2.5 volts.

Thus, the present inventor concluded that the above described process was not available for the stacked type storage capacitors of the dynamic random access memory cells.

SUMMARY OF THE INVENTION

It is therefore an important object of the present invention to provide a process of fabricating a dynamic random access memory device which forms a storage capacitor small in leakage current across a tantalum oxide layer and contacts low in resistance.

The present inventor contemplated the problem, and noticed that the leakage current had been affected by the heat treatment after the deposition of the tantalum oxide. In detail, the present inventor deposited tantalum oxide layers at 450 degrees centigrade and annealed the tantalum oxide layers for an hour at different temperatures. The present inventor plotted the leakage current across the tantalum oxide layers in terms of the potential level Vp applied to the cell plate electrodes as shown in FIG. 1.

Plots A1, A2, A3, A4 and A5 were representative of the annealing temperatures of 800 degrees centigrade, 700 degrees centigrade, 600 degrees centigrade, 500 degrees centigrade and 400 degrees centigrade, respectively, and plots A6 stood for the tantalum oxide layer without an annealing.

The plots A5 to A1 taught that higher annealing temperature increased the leakage current. For example, when the tantalum oxide layer was annealed at 500 degrees centigrade, the potential difference dVp1 at $10^{-8}$ A/cm$^2$ was about 3.2 volts, and was close to the critical potential difference. On the other hand, when the tantalum oxide layer was annealed at 600 degrees centigrade, the potential difference dVp2 was decreased to 2.4 volts, and lost the margin. Although plots were not shown in FIG. 1, the temperature dependency became clear around the annealing temperature between 50 degrees centigrade and 540 degrees centigrade, and the tantalum oxide layer annealed at 530 degrees centigrade resulted in the critical potential difference of 3.0 volts.

Considering fluctuation of process parameters, the present inventor concluded that it was necessary for the storage capacitor of the dynamic random access memory cell to suppress the heat treatment after the deposition of the tantalum oxide to about 500 degrees centigrade.

To accomplish the object, the present invention proposes to fabricate a dynamic random access memory device without a heat treatment higher than 500 degrees centigrade after a deposition of tantalum oxide.

In accordance with the present invention, there is provided a process of fabricating a semiconductor dynamic random access memory device, comprising the steps of: a) preparing a semiconductor substrate including a first area assigned to a plurality of memory cells and a second area assigned to peripheral circuits, at least one complementary transistor being incorporated in the peripheral circuits; b) fabricating switching transistors of the plurality of memory cells and the at least one complementary transistor on the semiconductor substrate; c) covering the switching transistors and the at least on complementary transistor with a lower inter-level insulating structure having first contact holes exposing first impurity regions of the switching transistors; d) fabricating storage capacitors having respective storage node electrodes respectively held in contact through the first contact holes with the first impurity regions, dielectric films of tantalum oxide covering the storage node electrodes and at least one cell plate electrode held in contact with the dielectric films so as to be opposed to the storage node electrodes; and e) covering the storage capacitors with an upper inter-level insulating structure having second contact holes exposing second impurity regions of the at least one complementary transistor by using a deposition technique carried out at a first temperature equal to or less than 530 degrees centigrade; and f) forming at least one interconnection on the upper inter-level insulating structure connected through the second contact holes with the second impurity regions by using techniques carried out at second temperatures equal to or less than 530 degrees centigrade.

BRIEF DESCRIPTION OF THE DRAWINGS

The features and advantages of the process of fabricating a dynamic random access memory device according to the present invention will be more clearly understood from the following description taken in conjunction with the accompanying drawings in which:

FIG. 1 is a graph showing the temperature dependency of the leakage current in terms of the potential level on the cell plate of the storage capacitor;

DESCRIPTION OF THE PREFERRED EMBODIMENTS

First Embodiment

Figure 2A:
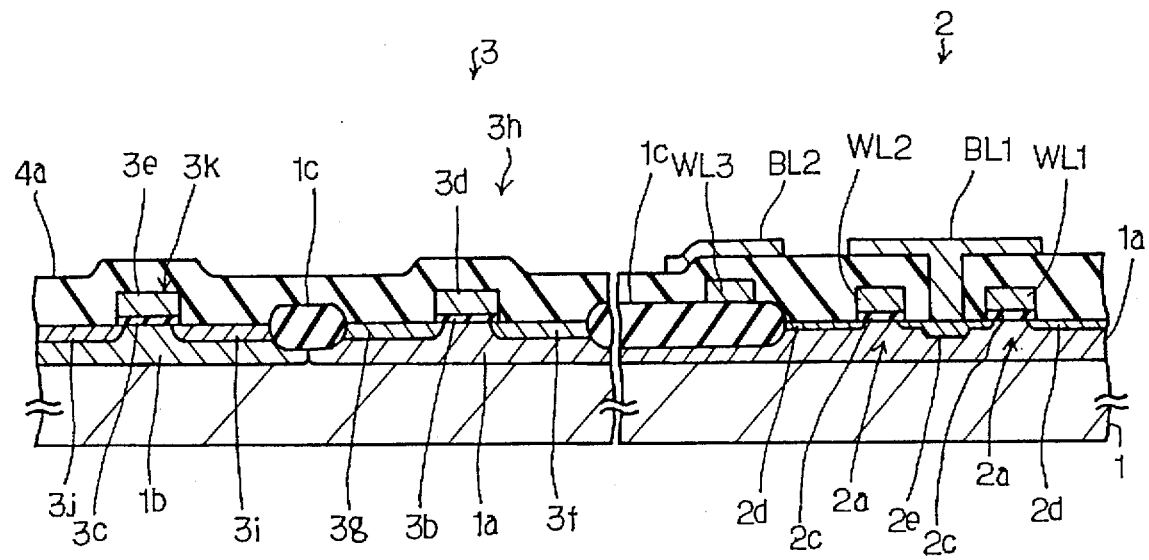
FIGS. 2A to 2C are cross sectional views showing a process sequence for fabricating a dynamic random access memory device according to the present invention.
Figure 2B:
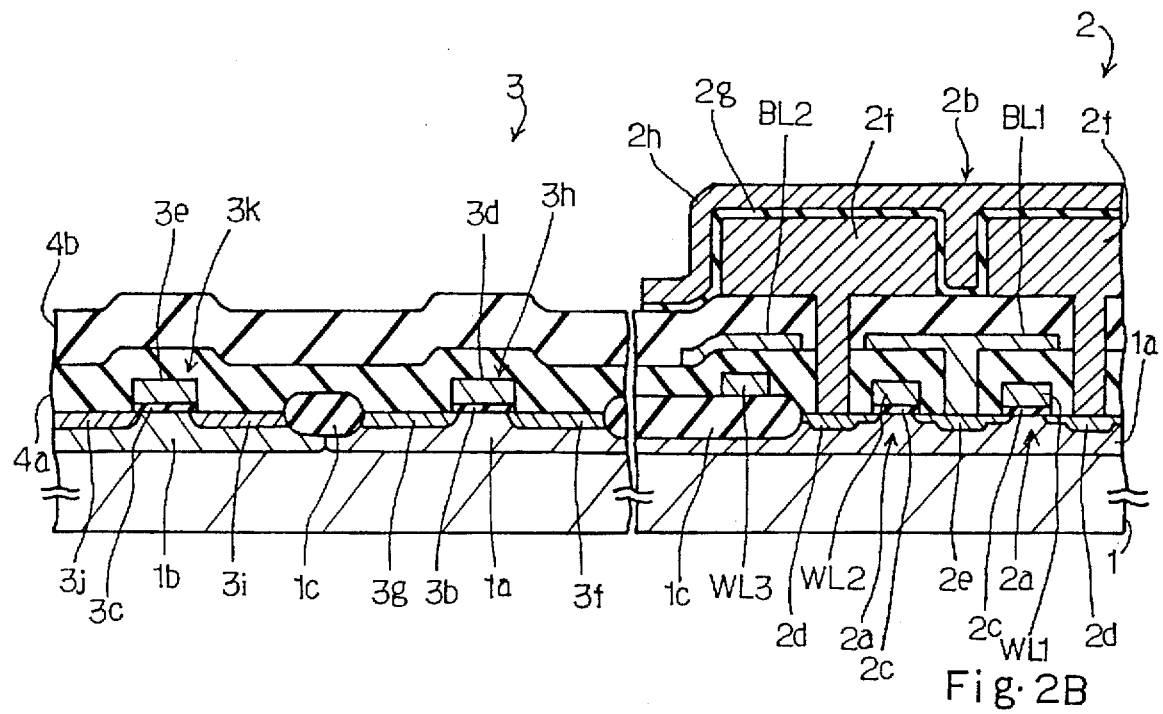
Figure 2C:
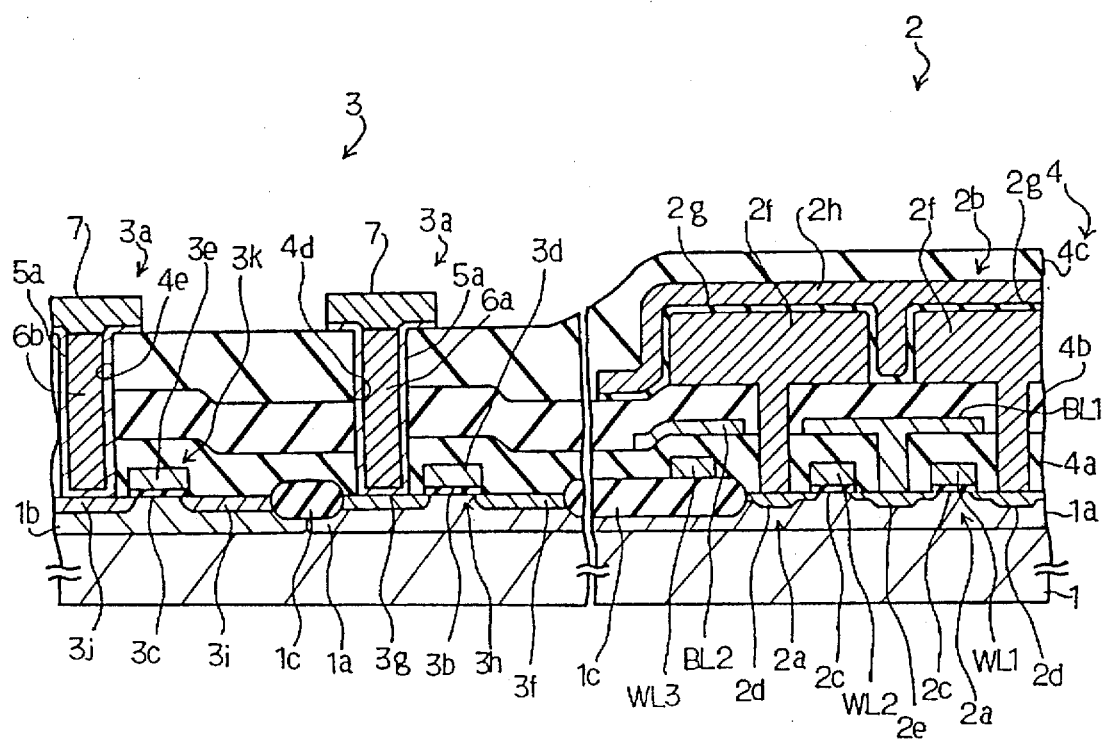

Referring first to FIGS. 2A to 2C of the drawings, a semiconductor dynamic random access memory device is fabricated on a p-type silicon substrate 1. The semiconductor dynamic random access memory device is designed under 0.4 micron design rules. The p-type silicon substrate 1 has a major surface divided into a first area assigned to a memory cell array 2 and a second area assigned to peripheral circuits 3 implemented by complementary transistors 3a. The memory cells of the cell array 2 are of the type having an n-channel enhancement type switching transistor 2a and a stacked type storage capacitor 2b coupled in series, and a series of a p-channel enhancement type field effect transistor and an n-channel enhancement type field effect transistor forms each of the complementary transistors 3a.

The process of fabricating a semiconductor dynamic random access memory device starts with preparation of the p-type silicon substrate 1, and p-type wells 1a and n-type wells 1b are formed in the major surface of the p-type silicon substrate 1 by using an ion implantation. Boron is ion implanted into the selected surface portions of the p-type silicon substrate 1 at dose of $1 \times 10^{13}$ cm$^{-2}$ under 150 KeV, and the implanted boron forms the p-type wells 1a of 2 microns in depth. Phosphorous is ion implanted into other selected surface portions of the p-type silicon substrate 1 at dose of $2 \times 10^{13}$ cm$^{-2}$ under 150 KeV, and the implanted phosphorous forms the n-type wells 1b of 2 microns in depth.

A thick field oxide layer 1c is selectively grown to 350 nanometers thick on the major surface of the p-type silicon substrate 1 by using the local oxidation of silicon process, and defines active areas for pairs of memory cells and the p-type/n-type enhancement type field effect transistors 1a/1b.

The surface portions of the active areas are thermally oxidized so as to grow silicon oxide films 2c and 3b/3c, and the silicon oxide films 2c and 3b/3c are 10 nanometers in thickness.

Subsequently, polysilicon is deposited over the entire surface of the resultant structure to 100 nanometers thick by using a chemical vapor deposition, and, thereafter, tungsten silicide is sputtered to 100 nanometers thick on the polysilicon layer.

An appropriate photo-resist layer (not shown) is patterned on the tungsten silicide layer, and covers parts of the tungsten silicide layer. Using the patterned photo-resist layer as a mask, the tungsten silicide layer and the polysilicon layer are successively etched, and word lines WL1/WL2/WL3 and the gate electrodes 3d/3e are formed on the silicon oxide films 2c and 3b/3c. The word lines WL1/WL2/WL3 and the gate electrodes 3d/3e have the polyside structure, and are 200 nanometers thick. The patterned photo-resist layer is stripped off.

Another photo-resist layer (not shown) is patterned so as to cover the second area assigned to the peripheral circuits 3. Using the patterned photo-resist layer, the field oxide layer 1c and the word lines WL1/WL2/WL3 as a mask, phosphorous is ion implanted into the active areas assigned to the memory cells at dose of $1.2 \times 10^{13}$ cm$^{-2}$ under 30 KeV, and n-type source and drain regions 2d/2e are formed on both sides of each word line WL1/WL2/WL3. The patterned photo-resist layer is stripped off. The silicon oxide film 2c, the part of the word line WL1/WL2/WL3 and the n-type source and drain regions 2d and 2e as a whole constitute the n-channel enhancement type switching transistor 2a.

A photo-resist layer is patterned so as to cover the first area assigned to the memory cell array 2 and the n-type wells 1b. Using the patterned photo-resist layer, the gate electrode 3d and the field oxide layer 1c as a mask, arsenic is ion implanted into the active areas in the p-type wells 1a at dose of $2-3 \times 10^{15}$ cm$^{-2}$ under 30 KeV, and n-type source and drain regions 3f and 3g are formed on both sides of each gate electrode 3d. The patterned photo-resist layer is stripped off, and the silicon oxide film 3b, the gate electrode 3d and the n-type source and drain regions 3f and 3g form in combination the n-channel enhancement type field effect transistor 3h.

A photo-resist layer (not shown) is patterned so as to cover the first area assigned to the memory cell array 2 and the p-type wells 1a. Using the patterned photo-resist layer, the field oxide layer 1c and the gate electrode 3e as a mask, boron fluoride (BF$_2$) is ion implanted into the exposed active areas at dose of $3 \times 10^{15}$ cm$^{-2}$ under 30 KeV, and p-type source and drain regions 3i and 3j are formed on both sides of each gate electrode 3e. The silicon oxide film 3c, the gate electrode 3e and the p-type source and drain regions 3i and 3j as a whole constitute the p-channel enhancement type field effect transistor 3k. The patterned photo-resist layer is stripped off.

The n-type source and drain regions 2d/2e, the n-type source and drain regions 3f/3g and the p-type source and drain regions 3i/3j finally form the p-n junctions together with the p-type/n-type wells 1a/1b around 0.15 micron from the major surface of the p-type silicon substrate 1.

Subsequently, a first inter-level insulating layer 4a in the silicon oxide system covers the n-channel enhancement type switching transistors 2a, the n-channel enhancement type field effect transistors 3h and the p-channel enhancement type field effect transistors 3k.

Bit contact holes are formed in the first inter-level insulating layer 4a, and the n-type drain regions 2e are partially exposed to the bit contact holes. In this instance, the bit contact hole is 0.4 micron square.

Phosphorous is ion implanted through the bit contact holes into the n-type drain regions 2e at dose of $1 \times 10^{15}$ cm$^{-2}$ under 30 KeV. The LDD (Lightly Doped Drain) structure is obtained.

Polysilicon is deposited to 100 nanometers thick on the first inter-level insulating layer 4a by using a chemical vapor deposition, and, thereafter, tungsten silicide is sputtered to 100 nanometers thick onto the polysilicon layer. The polysilicon and the tungsten silicide fill the bit contact holes, and the polysilicon layer and the tungsten silicide layer are patterned into bit lines BL1 and BL2 of the silicide structure of 200 nanometers thick. The bit lines BL1/BL2 pass through the bit contact holes, and are held in contact with the n-type drain regions 2e. The resultant structure is illustrated in FIG. 2A.

A second inter-level insulating layer 4b in the silicon oxide system covers the bit lines BL1/BL2 and the exposed surface of the first inter-level insulating layer 4a, and is 300 nanometers thick. Storage node contact holes are formed in the first and second inter-level insulating layers 4a and 4b, and the n-type source regions 2d are partially exposed to the storage node contact holes. The storage node contact holes are 0.4 micron square.

Phosphorous is ion implanted through the storage node contact holes into the n-type source regions 2d at dose of $1 \times 10^{15}$ cm$^{-2}$ under 30 KeV, and completes the n-type source regions 2d. As described hereinbefore, the n-type source and drain regions 2d and 2e finally penetrate into the p-type well 1a by 1.5 micron.

Polysilicon is deposited to 600 nanometers thick over the second inter-level insulating layer 4b by using the chemical vapor deposition, and tungsten silicide is sputtered to 100 nanometers thick on the polysilicon layer. The tungsten silicide layer and the polysilicon layer are successively patterned so as to form storage node electrodes 2f of the polyside structure of 700 nanometers thick. The storage node electrodes 2f pass the storage node contact holes, and are held in contact with the n-type source regions 2d.

The resultant structure is placed in a reaction chamber, and gaseous mixture of ethoxy tantalum, i.e., $Ta(OC_2H_5)_5$ and oxygen is introduced into the reaction chamber. Tantalum oxide is produced at 450 degrees centigrade, and is deposited to 100 nanometers thick over the storage node electrodes 2f and the exposed surface of the second inter-level insulating layer 4b. The tantalum oxide layer of 100 nanometers thick is equivalent to a silicon oxide layer of 2.5 nanometers thick.

Titanium nitride is deposited to 100 nanometers thick over the tantalum oxide layer by using a reactive sputtering, and tungsten silicide is sputtered to 100 nanometers thick over the titanium nitride layer. An appropriate photo-resist layer is patterned so as to cover selected areas of the tungsten silicide layer over the storage node electrodes 2f. Using the patterned photo-resist layer as a mask, the tungsten silicide layer, the titanium nitride layer and the tantalum oxide layer are successively patterned into the dielectric films 2g of the tantalum oxide and cell plate electrodes 2h of the lamination of the tungsten silicide layer and the titanium nitride layer. The dielectric films 2g respectively covers the storage node electrodes 2f, and each of the cell plate electrodes 2h is shared between the adjacent storage node electrodes 2f. The patterned photo-resist layer is stripped off, and the storage node electrode 2f, the dielectric film 2g and the cell plate electrode 2h form in combination the storage capacitor 2b. The resultant structure is illustrated in FIG. 2B.

Subsequently, a third inter-level insulating layer 4c of 650 nanometers thick covers the cell plate electrodes 2h and the exposed area of the second inter-level insulating layer 4b. The third inter-level insulating layer 4c is formed of non-doped silicon oxide, and the non-doped silicon oxide is deposited by using a plasma-exited chemical vapor deposition. The first, second and third inter-level insulating layers 4a, 4b and 4c as a whole constitute an inter-level insulating structure 4.

Contact holes 4d and 4e are formed in the inter-level insulating structure 4, and are 0.4 micron square. The contact hole 4d reaches the n-type drain region 3g of each n-channel enhancement type field effect transistor 3h, and the contact hole 4e reaches the p-type drain region 3j of each p-channel enhancement type field effect transistor 3k.

A silicon oxide layer (which is hereinlater described with reference to FIG. 3A) of 10 nanometers thick is deposited over the entire surface of the inter-level insulating film structure 4 and the n-type/p-type drain regions 3g/3j by using an ECR (Electron Cyclotron Resonance) plasma-exited chemical vapor deposition. The silicon oxide layer covers the inner surfaces defining the contact holes 4d/4e.

Phosphorus is ion implanted through the contact holes 4d into the n-type drain regions 3g at dose of $3\times10^{14}$ cm$^{-2}$ under 70 KeV, and amorphizes the n-type drain regions 3g. As a result, an n-type ion-implanted sub-region is formed in each n-type drain region 3g. Similarly, boron fluoride, i.e., $BF_2$ is ion implanted through the contact hole 4e into the p-type drain regions 3j at dose of $3\times10^{15}$ cm$^{-2}$ under 70 KeV, and amorphizes the p-type drain regions 3j. As a result, a p-type ion-implanted sub-region is formed in each p-type drain region 3j. The n-type ion-implanted sub-region and the p-type ion-implanted sub-region will be hereinlater described in detail.

The silicon oxide layer is removed from at least the upper surface of the third inter-level insulating layer 4c and the n-type/p-type drain regions 3g/3j exposed to the contact holes 4d/4e.

Titanium is sputtered to 40 nanometers thick over the entire surface of the structure, and titanium nitride is deposited to 60 nanometers thick over the titanium layer by using the reactive sputtering. The titanium layer (not shown) and the titanium nitride layer (not shown) form in combination a barrier metal layer 5a. The p-type substrate 1 is placed in nitrogen atmosphere, and is heated to 500 degrees centigrade for an hour. Silicidation takes place, and the titanium layer over the n-type/p-type drain regions 3g/3j is converted to titanium silicide layers (not shown).

While the titanium is being converted to the titanium silicide layers 6a and 6b, the ion-implanted n-type/p-type impurities are activated, and the n-type drain region 3g and the p-type drain region 3j are completed. However, the depth of the n-type/p-type drain regions 3g/3j are not changed.

Subsequently, tungsten hexafluoride, i.e., $WF_6$ is deoxidized with silane. Tungsten is deposited to 500 nanometers thick over the barrier metal layer 5a, and fills the contact holes 4d/4e. The tungsten layer is uniformly etched, and tungsten pieces 6a and 6b plug the contact holes 4d/4e. This is because of the fact that the contact hole 4d/4e are high in aspect ratio, and aluminum or aluminum alloy deposited around 500 degrees centigrade makes the step coverage poor.

Aluminum alloy such as, for example, Al—Cu alloy is sputtered to 400 nanometers thick over the tungsten pieces 6a and 6b and the exposed surface of the barrier metal layer 5a. A photo-resist layer is patterned on the aluminum alloy layer, and the aluminum alloy layer and the barrier metal layer 5a are partially etched away by using the patterned photo-resist layer as a mask.

Using gaseous mixture of hydrogen and nitrogen as forming gas, an alloying is carried out at 400 degrees centigrade for 20 minutes, and interconnections 7 are provided on the third inter-level insulating layer 4c. The patterned aluminum alloy layer the patterned barrier metal layer and the tungsten pieces 6a/6b constitute the interconnections 7. One of the interconnections 7 electrically connects the n-type drain region 3g of the n-channel enhancement type field effect transistor 3h and the p-type drain region 3j of the p-channel enhancement type field effect transistor 3k, and the n-channel enhancement type field effect transistor 3h and the p-channel enhancement type field effect transistor 3k form in combination one of the complementary transistors as shown in FIG. 2C.

Thus, the stacked type storage capacitors 2b are not subjected to heat more than 500 degrees centigrade after the completion thereof, and the leakage current across the dielectric film 2g is small enough to maintain a data bit in the form of electric charge.

Figure 3A:
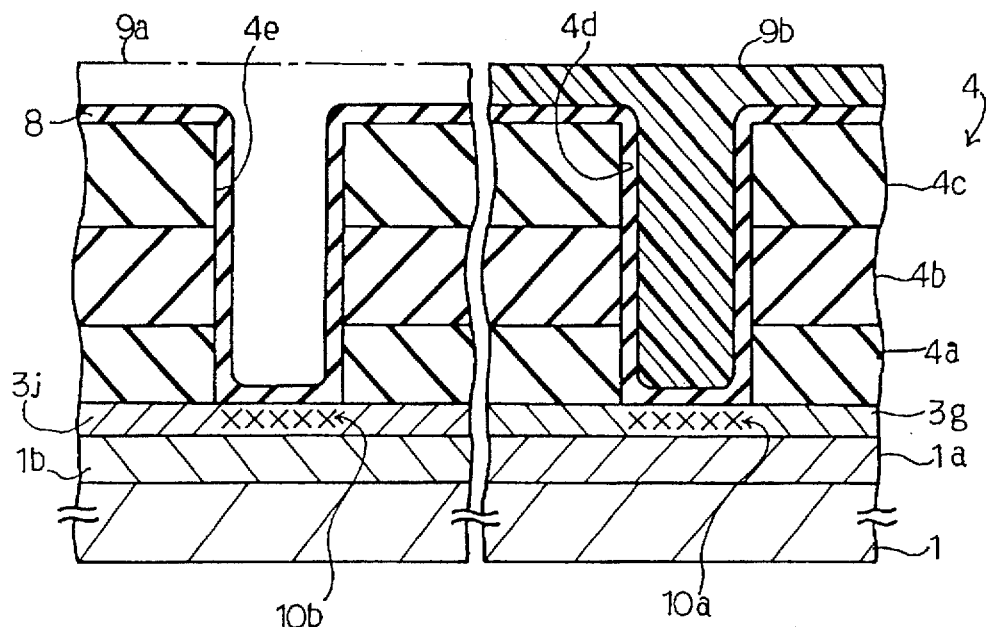
FIGS. 3A to 3C are cross sectional views showing a part of the process sequence for forming tungsten silicide layers on n-type/p-type drain regions of a complementary transistor.
Figure 3B:
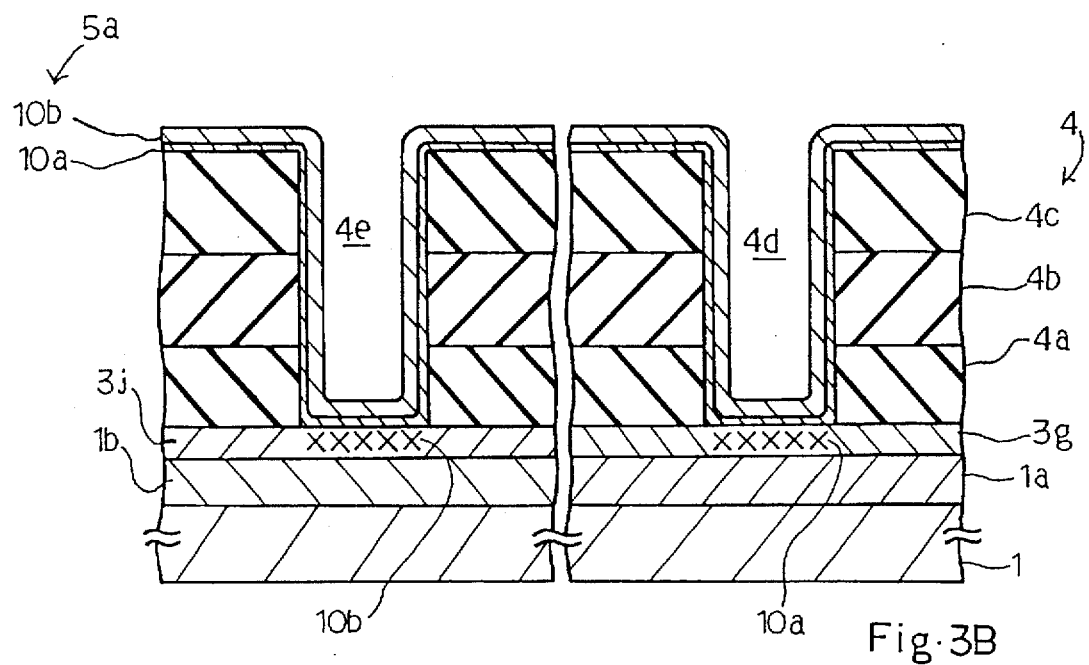
Figure 3C:
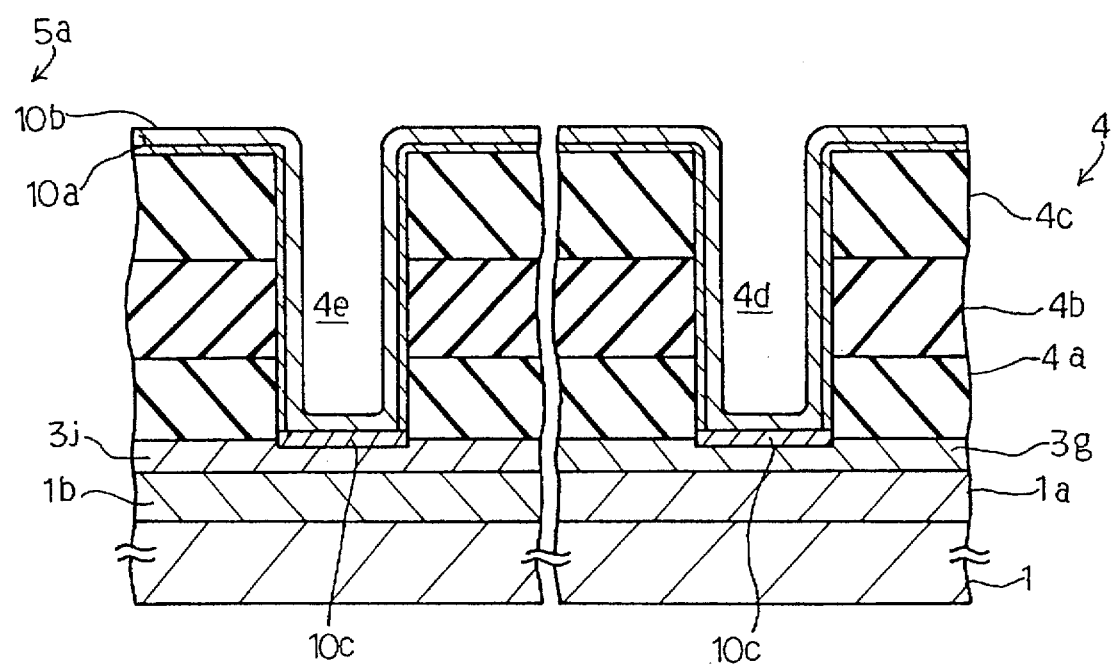

FIGS. 3A to 3C illustrate the contact holes 4d and 4e, and description is made on the steps of forming the tungsten silicide layers on the n-type/p-type drain regions in detail.

The first inter-level insulating layer 4a and the second inter-level insulating layer 4b are deposited through a low pressure chemical vapor deposition using gaseous mixture containing tetraethylorthosilicate, i.e. TEOS, and are formed of non-doped silicon oxide. These first and second inter-level insulating layers 4a and 4b are deposited before the deposition of the tantalum oxide, and, for this reason, the manufacturer is allowed to carry out the deposition in the low pressure chemical vapor deposition reactor over 500 degrees centigrade. The deposition carried out over 500 degrees centigrade topographically grows the first and second inter-level insulating layers 4a and 4b, and smooth step-coverage is achieved.

If the first inter-level insulating layer 4a and the second inter-level insulating layer 4b are subjected to an etch-back or a chemical-mechanical polishing, flat smooth surfaces are respectively created on the first and second inter-level insulating layers.

Thus, the deposition over 500 degrees centigrade creates the smooth topographical surfaces on the first and second inter-level insulating layers 4a and 4b. However, the third inter-level insulating layer 4c is formed after the completion of the stacked type storage capacitors 2b, and the tantalum oxide sets the limit on the deposition of the third inter-level insulating layer 4c as discussed with reference to FIG. 1. In this instance, the third interlevel insulating layer 4c is formed as follows.

First, non-doped silicon oxide is deposited to 250 nanometers thick on the second inter-level insulating layer 4b by using the plasma-exited chemical vapor deposition. The plasma-exited chemical vapor deposition can produce the non-doped silicon oxide at lower than 500 degrees centigrade. The non-doped silicon oxide layer is coated with spin-on-glass film, and the spin-on-glass film is baked at 400 degrees centigrade. The baked spin-on-glass film is subjected to the etch-back, and the etch-back creates a smooth surface. The chemical-mechanical polishing may be used for the smooth surface instead of the etch-back. Finally, non-doped silicon oxide is deposited to 50 nanometers thick over the smooth surface by using the plasma-exited chemical vapor deposition again. The non-doped silicon oxide layer, the spin-on-glass layer and the non-doped silicon oxide layer form in combination the third inter-level insulating layer 4c. The plasma-exited chemical vapor deposition is carried out at lower than 500 degrees centigrade.

After the completion of the inter-level insulating film structure 4, the contact holes 4d and 4e are formed in the inter-level insulating film structure 4. The contact holes 4d and 4e are 0.4 micron square as described hereinbefore.

Subsequently, the silicon oxide is deposited to 10 nanometers thick over the entire surface by using the ECR plasma-exited chemical vapor deposition. Even though the contact holes 4d/4e are high in the aspect ratio, the ECR plasma-exited chemical vapor deposition allows the silicon oxide layer 8 to topographically extend over the upper and inner surfaces of the inter-level insulating film structure 4 and the n-type/p-type drain regions 3g/3j exposed to the contact holes 4d/4e. In fact, the aspect ratio is of the order of 4 in this instance. The silicon oxide layer 8 is a protection layer against contamination due to photo-resist used in the ion-implantation into the p-type/n-type drain regions 3j/3g. It is necessary to prevent the n-type/p-type drain regions 3g/3j from the contamination, because the stacked type storage capacitors 2b prohibits the manufacturer from a heat treatment over 500 degrees centigrade.

Subsequently, a photo-resist layer is patterned so as to cover the contact hole 4e, and the patterned photo-resist layer 9a allows the n-type drain region 3g to expose to the n-type impurity ion implanted thereinto. As a result, the n-type drain regions 3g are amorphized, and an n-type ion-implanted sub-region 10a takes place in each n-type drain region 3g as indicated by mark "X". The patterned photo-resist layer 9a is stripped off after the ion-implantation.

Another photo-resist layer is patterned to cover the contact hole 4d, and the patterned photo-resist layer 9b allows the p-type drain regions 3j to expose to the p-type impurity implanted thereinto. The ion-implanted p-type impurity amorphizes the p-type drain regions 3j, and forms the p-type ion-implanted sub-region 10b in each p-type drain region 3j also indicated by the mark "X". The resultant structure is illustrated in FIG. 3A. Thereafter, the patterned photo-resist layer 9b is stripped off.

The ion-implantations for the ion-implanted sub-regions 10a/10b are carried out under suitable conditions which do not allows the n-type impurity and the p-type impurity to pass through the n-type drain region 3g and the p-type drain region 3j.

Temperature of the silicidation is dependent on the conditions of the ion implantation, and the conditions will be hereinlater described in detail.

After the ion-implantation, the silicon oxide layer 8 is etched away in fluoric acid diluted to a fiftieth. The titanium layer 10a is sputtered to 50 nanometers thick on the exposed surfaces of the inter-level insulating layer 4 and the n-type/p-type drain regions 3g/3j, and the titanium nitride layer 10b is deposited to 100 nanometers thick on the titanium layer 10a by using the reactive sputtering. The titanium layer 10a and the titanium nitride layer 10b are thinner on the vertical side surfaces of the interlevel insulating film structure 4 rather than on the upper surface of the inter-level insulating film structure 4, and are ten to tens percent of those on the upper surface. The titanium layer 10a and the titanium nitride layer 10b form in combination the barrier metal layer 5a as shown in FIG. 3B.

The p-type silicon substrate 1 is placed in nitrogen atmosphere, and the titanium is heated to 500 degrees centigrade for an hour. The titanium held in contact with the silicon is converted to the titanium silicide ($TiSi_2$), and the titanium silicide layer 10c covers the n-type/p-type drain regions 3g/3j exposed to the contact holes 4d/4e. While the titanium is being converted to the titanium silicide, the ion-implanted sub-regions 10a and 10b are recrystalized and activated, and the n-type drain region 3g and the p-type drain region 3j are completed. The resultant structure is illustrated in FIG. 3C.

As will be appreciated from the foregoing description, the process of fabricating the dynamic random access memory device does not apply heat to the dielectric films 2g after the deposition of the tantalum oxide, and the leakage current across the dielectric film 2g does not exceed the critical value.

Second Embodiment

Figure 4A:
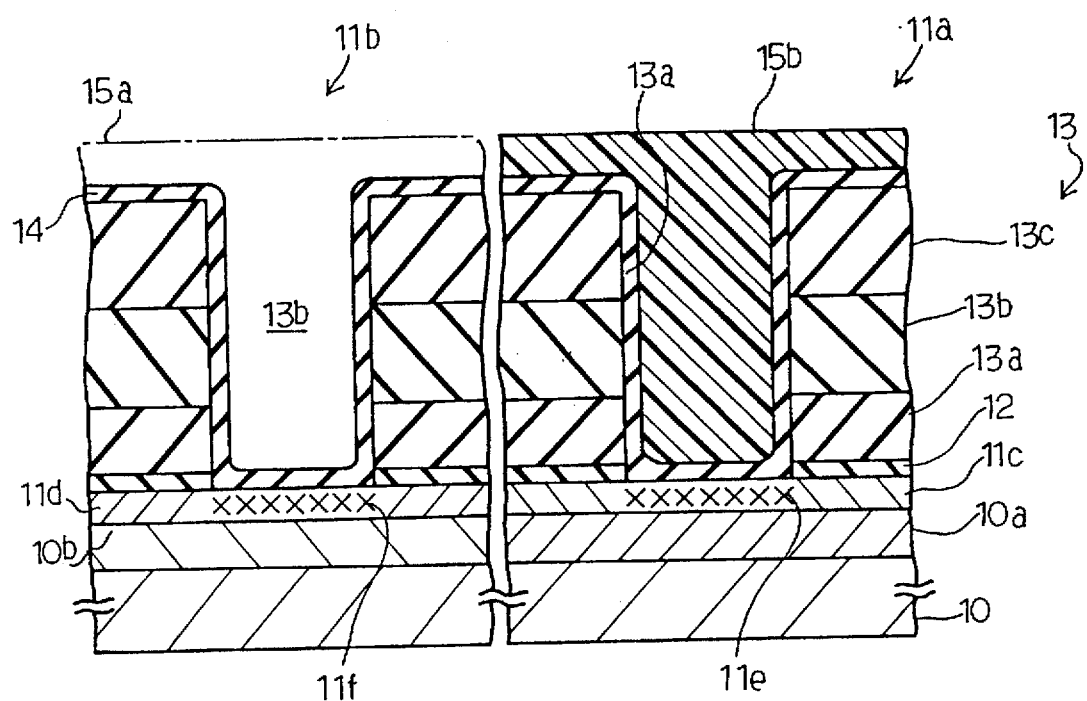
FIGS. 4A to 4C are cross sectional views showing steps of another process sequence for forming titanium silicide layers according to the present invention.
Figure 4B:
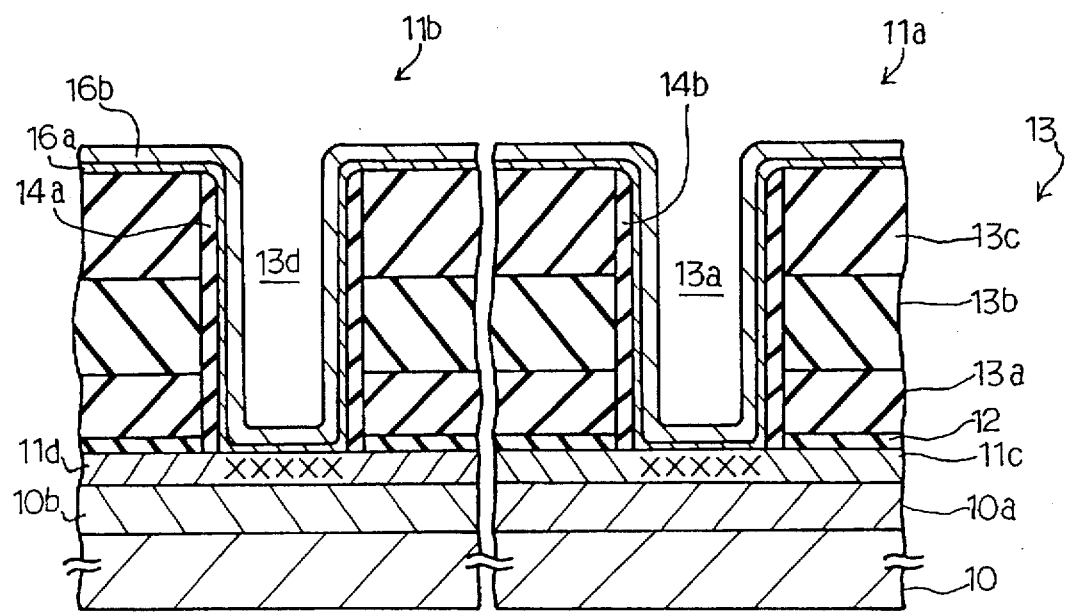
Figure 4C:
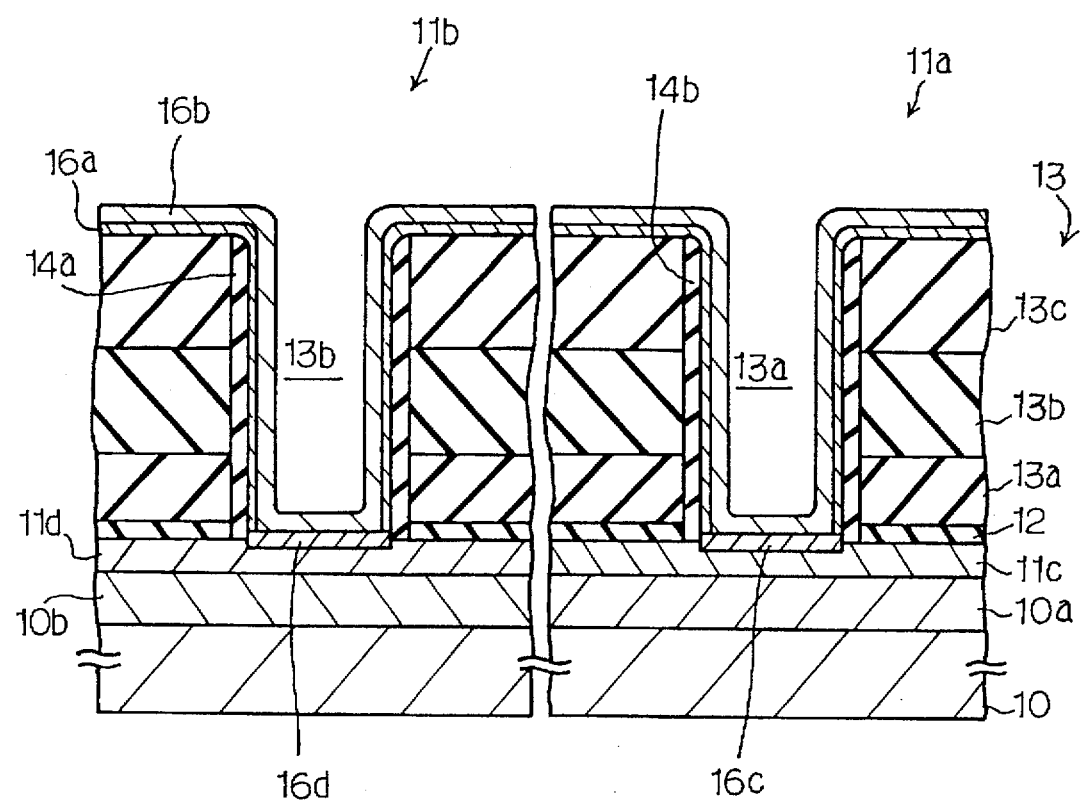

FIGS. 4A to 4C illustrate essential steps of another process sequence embodying the present invention. The process also starts with preparation of a p-type silicon substrate 10. P-type and and n-type wells 10a and 10b are formed on the p-type silicon substrate 10, and n-channel enhancement type switching transistors (not shown), n-channel enhancement type field effect transistors 11a and p-channel enhancement type field effect transistors 11b are fabricated on the p-type and n-type wells 10a and 10b as similar to the first embodiment. An n-type drain region 11c of the n-channel enhancement type field effect transistor 11a and a p-type drain region 11d of the p-channel enhancement type field effect transistor 11b are illustrated in FIGS. 4A to 4C. The n-channel enhancement type switching transistors form dynamic random access memory cells together with stacked type storage capacitors (not shown), respectively, and the n-channel enhancement type field effect transistors 11a are connected to the p-channel enhancement type field effect transistors 11b so as to form complementary transistors.

After the fabrication of the n-channel enhancement type switching transistors, the n-channel enhancement type field effect transistors 11a and the p-channel enhancement type field effect transistors 11b, non-doped silicon oxide is deposited to 10 nanometers thick over the entire surface of the resultant structure by using the low-pressure chemical vapor deposition, and the non-doped silicon oxide layer (HTO) 12 is prepared for a reflow on first and second inter-level insulating layers 13a and 13b. The first and second inter-level insulating layers 13a and 13b are formed of boro-phosphosilicate glass through the low-pressure chemical vapor deposition using tetraethylorthosilicate (TEOS), and are subjected to the reflow.

The stacked type storage capacitors (not shown) are fabricated on the second inter-level insulating layer 13b, and the dielectric films of the storage capacitors contain tantalum oxide films as similar to the first embodiment. A third inter-level insulating layer 13c is deposited over the second inter-level insulating layer 13b, and the first, second and third inter-level insulating layers 13a, 13b and 13c as a whole constitute an inter-level insulating film structure 13.

A photo-resist layer (not shown) is patterned on the third inter-level insulating layer 13c, and the inter-level insulating film structure 13 is partially etched away by using the patterned photo-resist layer as a mask. Contact holes 13a and 13b are formed in the inter-level insulating film structure 13, and reach the n-type and p-type drain regions 11c and 11d.

A protective silicon oxide layer 14 of 10 nanometers thick is deposited over the entire surface of the structure by using the ECR plasma-exited chemical vapor deposition.

A photo-resist layer is patterned so as to cover the contact holes 13b, and the patterned photo-resist layer 15a exposes the contact holes 13a to an ion-implantation of n-type impurity. The n-type impurity amorphizes the n-type drain region 11c, and forms an n-type ion-implanted sub-region 11e. The patterned photo-resist layer 15a is stripped off.

Another photo-resist layer is patterned so as to cover the contact holes 13a, and the patterned photo-resist layer 15b exposes the contact holes 13b to an ion-implantation of p-type impurity. The p-type impurity amorphizes the p-type drain region 11d, and forms a p-type ion-implanted sub-region 11f as shown in FIG. 4A. The patterned photo-resist layer 15b is stripped off.

Temperature of silicidation is dependent on the conditions of the ion-implantation, and the conditions will be hereinlater described in detail.

The protective silicon oxide layer 14 is etched back by using an anisotropic etching technique, and spacers 14a and 14b of silicon oxide remain on the vertical inner walls of the inter-level insulating structure 13 defining the contact holes 13a and 13b. The spacers 14a and 14b do not expose the first and second inter-level insulating layers 13a and 13b of the boro-phospho-silicate glass to the contact holes 13a and 13b. Though not shown in FIGS. 4A to 4C, the vertical side walls of the bit contact holes and the vertical side walls of the storage node contact holes are also covered with spacers of the silicon oxide.

A titanium layer 16a and a titanium nitride layer 16b are deposited over the entire surface of the structure as similar to the first embodiment. The resultant structure is illustrated in FIG. 4B.

The p-type silicon substrate 10 is placed in nitrogen atmosphere, and is heated to 500 degrees centigrade for an hour. The titanium layer 16a held in contact with the silicon is converted to titanium silicide layers 16c and 16d, and the n-type and p-type ion-implanted sub-regions 11e and 11f are recrystallized so that the n-type and p-type drain regions 11c and 11d are completed as shown in FIG. 4C.

Thereafter, interconnections (not shown) are patterned as similar to the first embodiment.

The process sequence of the second embodiment does not have a heat treatment over 500 degrees centigrade after the deposition of the tantalum oxide, and the leakage current is small.

Optimum Conditions for Silicidation

Figure 5:
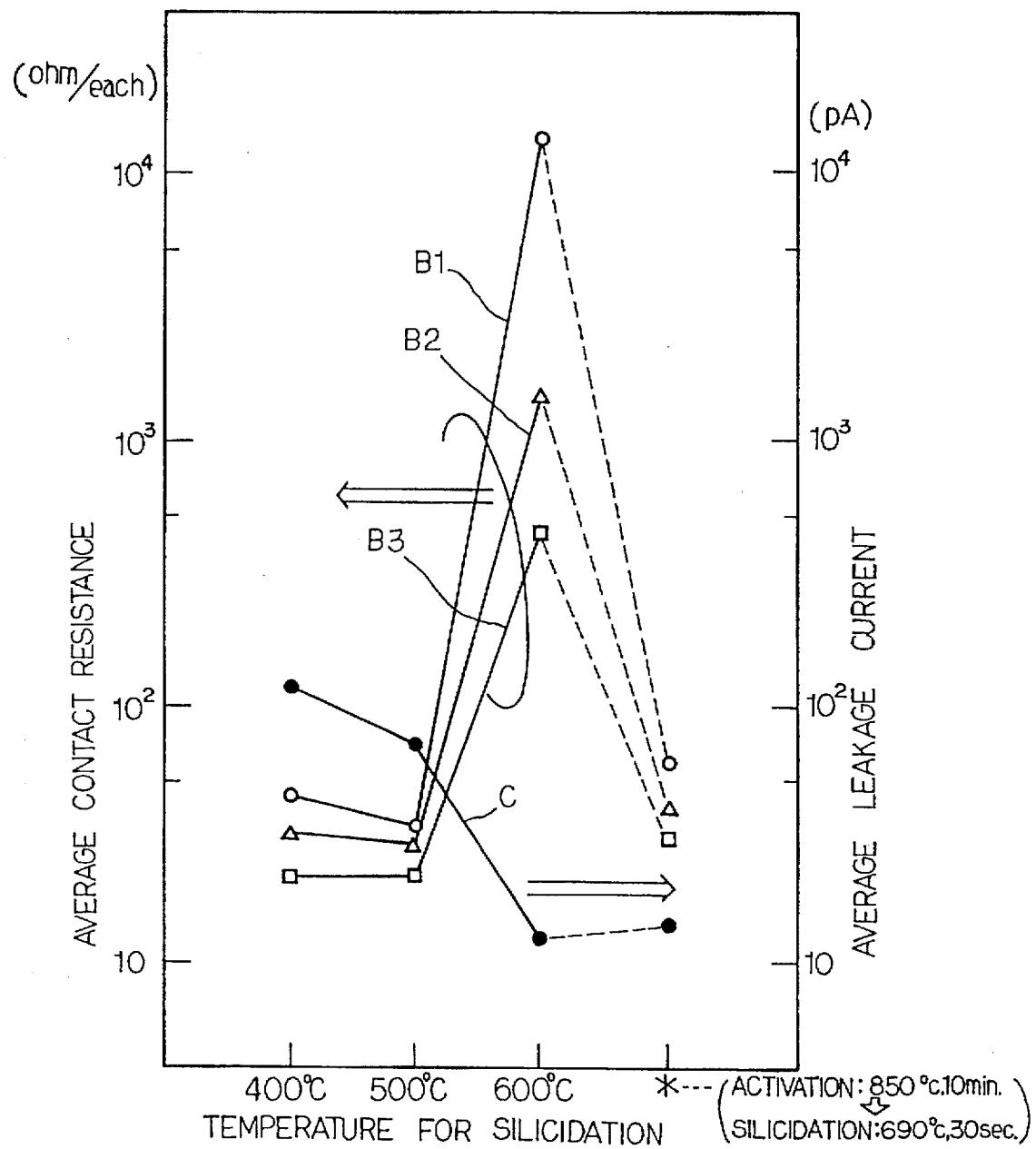
FIG. 5 is a graph showing the temperature dependency of contact resistance/leakage current of a contact hole open to an n-type impurity region.
Figure 6:
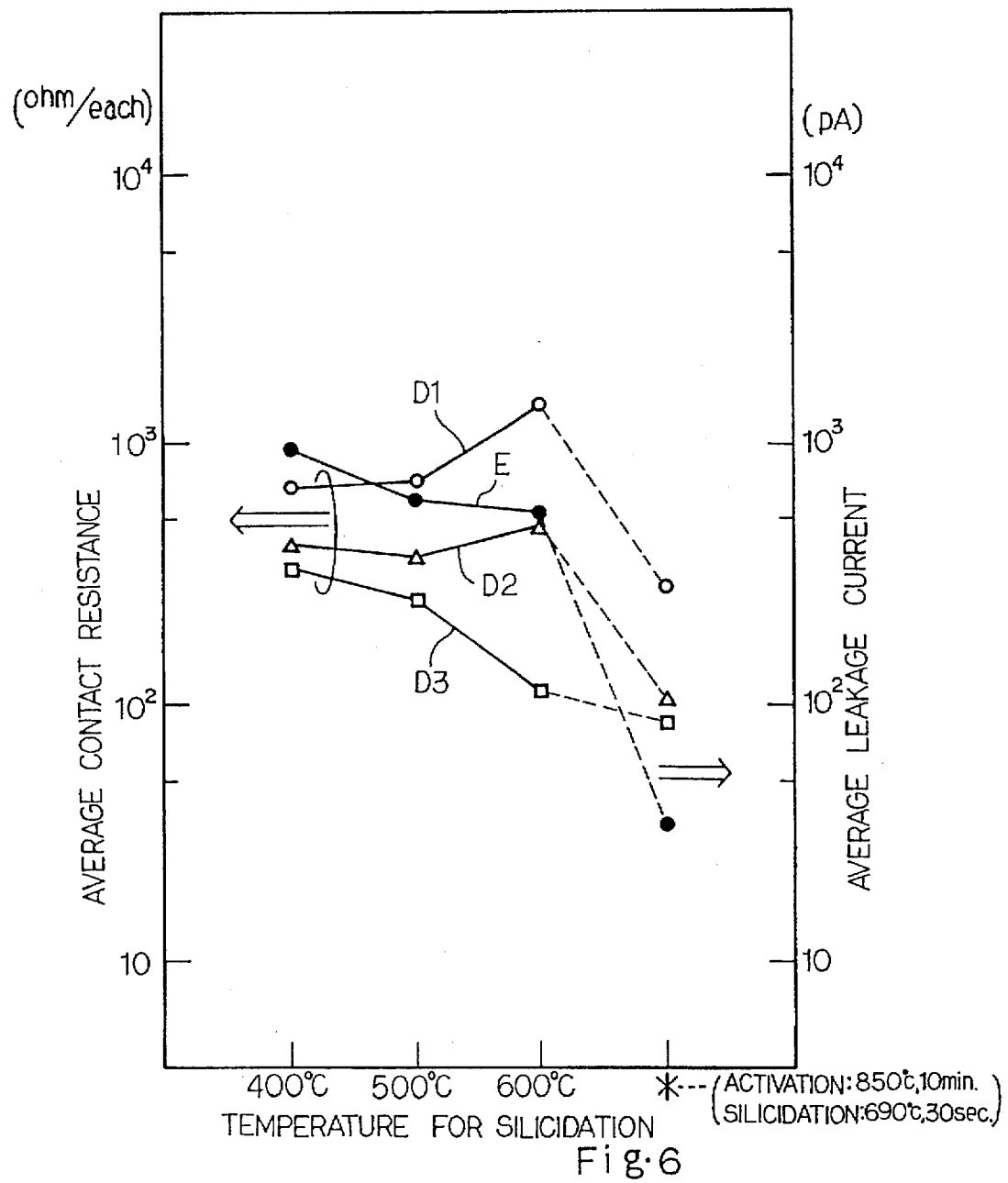
FIG. 6 is a graph showing the temperature dependency of contact resistance/leakage current of a contact hole open to a p-type impurity region.

FIGS. 5 and 6 illustrate the temperature dependency of the contact resistance of a contact hole and the temperature dependency of the contact leakage current.

The present inventor formed a plurality of n-type impurity regions, and phosphorous was ion implanted into the n-type impurity regions at dose of $3 \times 10^{14}$ cm$^{-2}$ under 70 KeV. Each of the n-type impurity region was 0.0272 mm$^2$, and formed a p-n junction around 0.15 micron in depth. Each of the n-type impurity regions was exposed to fifteen contact holes, and the fifteen contact holes were one of 0.4 micron square, 0.5 micron square and 0.6 micron square.

The present inventor further formed a plurality of p-type impurity regions, and boron fluoride was ion implanted into the p-type impurity regions at dose of $3 \times 10^{15}$ cm$^{-2}$ under 70 KeV. Each of the p-type impurity regions was 0.0272 mm$^2$, and formed a p-n junction around 0.15 micron in depth. Each of the p-type impurity regions was exposed to fifteen contact holes, and the fifteen contact holes were one of 0.4 micron square, 0.5 micron square and 0.6 micron square.

The reason why the contact holes of 0.5 micron square and the contact holes of 0.6 micron square were prepared was to evaluate influences of the dimensions of the contact hole.

Titanium was deposited over the n-type impurity regions and the p-type impurity regions, and the titanium layers were converted to the titanium silicide layers in nitrogen atmosphere created in a reactor tube. In detail, the nitrogen was maintained at the atmospheric pressure. The titanium layers were coverted to the titanium silicide layers at different temperatures, and the silicidation was carried out for an hour. The titanium silicide layers in every fifteen contact holes were coupled in parallel, and were applied with 5 volts. The current across the fifteen titanium silicide layers were measured, and the average contact resistance of each contact was calculated and plotted in FIGS. 5 and 6.

Plots B1, B2 and B3 of FIG. 5 are indicative of the average contact resistance of the titanium silicide layer in the contact of 0.4 micron square open to the n-type impurity region, the average resistance of the titanium silicide layer in the contact of 0.5 micron square open to the n-type impurity region and the average resistance of the titanium silicide layer in the contact of 0.6 micron square open to the n-type impurity region.

The present inventor further measured the leakage current across the titanium silicide layer in the contact holes of 0.4 micron square open to the n-type impurity region, and ploted the average leakage current as indicated by Plots C.

Plots D1, D2 and D3 of FIG. 6 are indicative of the average contact resistance of the titanium silicide layer in the contact of 0.4 micron square open to the p-type impurity region, the average resistance of the titanium silicide layer in the contact of 0.5 micron square open to the p-type impurity region and the average resistance of the titanium silicide layer in the contact of 0.6 micron square open to the p-type impurity region.

The present inventor further measured the leakage current across the titanium silicide layer in the contact holes of 0.4 micron square open to the p-type impurity region, and plotted the average leakage current as indicated by Plots E.

As will be understood from FIG. 5, when the temperature was increased to 500 degrees centigrade, the average contact resistance was decreased regardless of the dimensions of the contact. However, the contact resistance was rapidly increased at 600 degrees centigrade.

Similarly, the average contact resistance across the p-type silicide layers was decreased in the temperature range between 400 degrees and 500 degrees centigrade regardless of the dimensions of the contact. However, the tendency of the contact resistance was not constant at 600 degrees centigrade. Although the contact resistance in the contact hole of 0.6 micron square was decreased, the contact resistance in the contact hole of 0.4 micron square and the contact resistance in the contact hole of 0.5 micron were increased at 600 degrees centigrade, and the different tendency may be derived from the dimensions of the contact hole. The contact resistance at 400 degrees centigrade was around 1 kilo-ohm, and, for this reason, it was necessary for the titanium layer in the contact hole of 0.4 micron square to be converted to the titanium silicide at higher than 400 degrees centigrade.

Therefore, the present inventor concluded that the silicide layers were available for the dynamic random access memory device in so far as the silicidation was carried out between 400 degrees and 500 degrees centigrade, because the contact resistance was lower than 1 kilo-ohm.

Though not plotted in FIGS. 5 and 6, when the titanium was converted to the titanium silicide in nitrogen atmosphere by using a rapid thermal treatment for 1 to 5 minutes, the contact resistances in all the contact holes became lower than the contact resistances at 600 degrees centigrade. On the other hand, when the titanium was converted to the titanium silicide through the rapid thermal treatment at 500 degrees centigrade for 1 to 5 minutes, the contact resistances in all the contact holes were on the same par with the those on Plots B1 to B3 and D1 to D3. The same tendency was observed in the range from 470 degrees centigrade to 550 degrees centigrade. On the other hand, when the titanium was converted to the titanium silicide through the rapid thermal treatment at 400 degrees centigrade for 1 to 5 minutes, the contact resistances in all the contact holes were higher than those on Plots B1 to B3 and D1 to D3.

The present inventors further concluded that the silicidation at 500±30 degrees centigrade was theoretically more preferable in consideration of the shrinkage of time by virtue of the rapid thermal treatment. Because, the amorphous silicon due to the ion-implantation was recrystallized at 470 degrees centigrade, and the heat treatment at 530 degrees or more made the tantalum oxide reach the critical potential difference on the cell plate electrode.

The leakage current across the titanium silicide layers on both n-type/p-type impurity regions was decreased when the temperature for the silicidation was increased.

Figure 7:
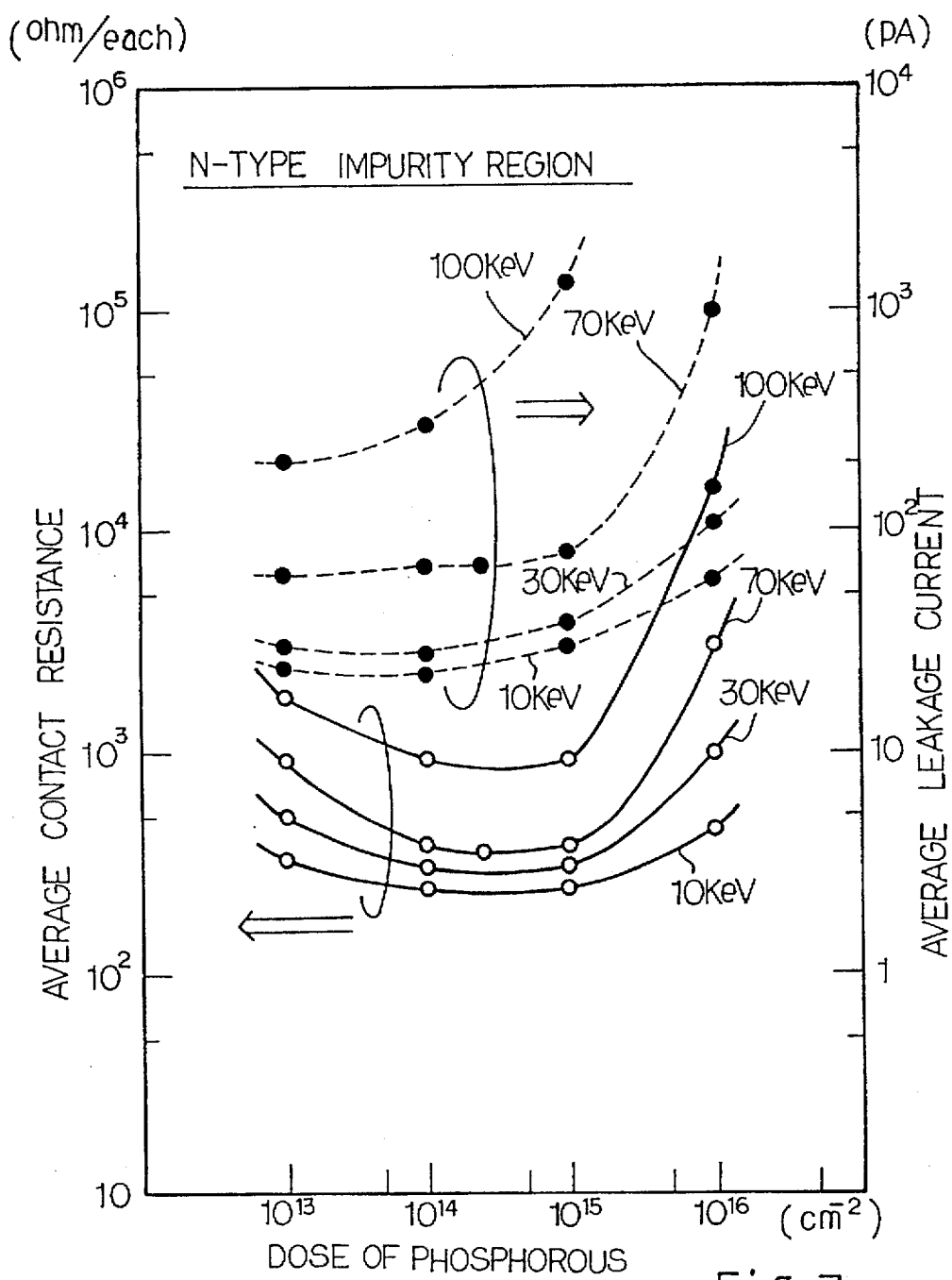
FIG. 7 is a graph showing the implanted ion dependency of a contact resistance and the dopant concentration dependency of leakage current for a contact open to an n-type impurity region.
Figure 8:
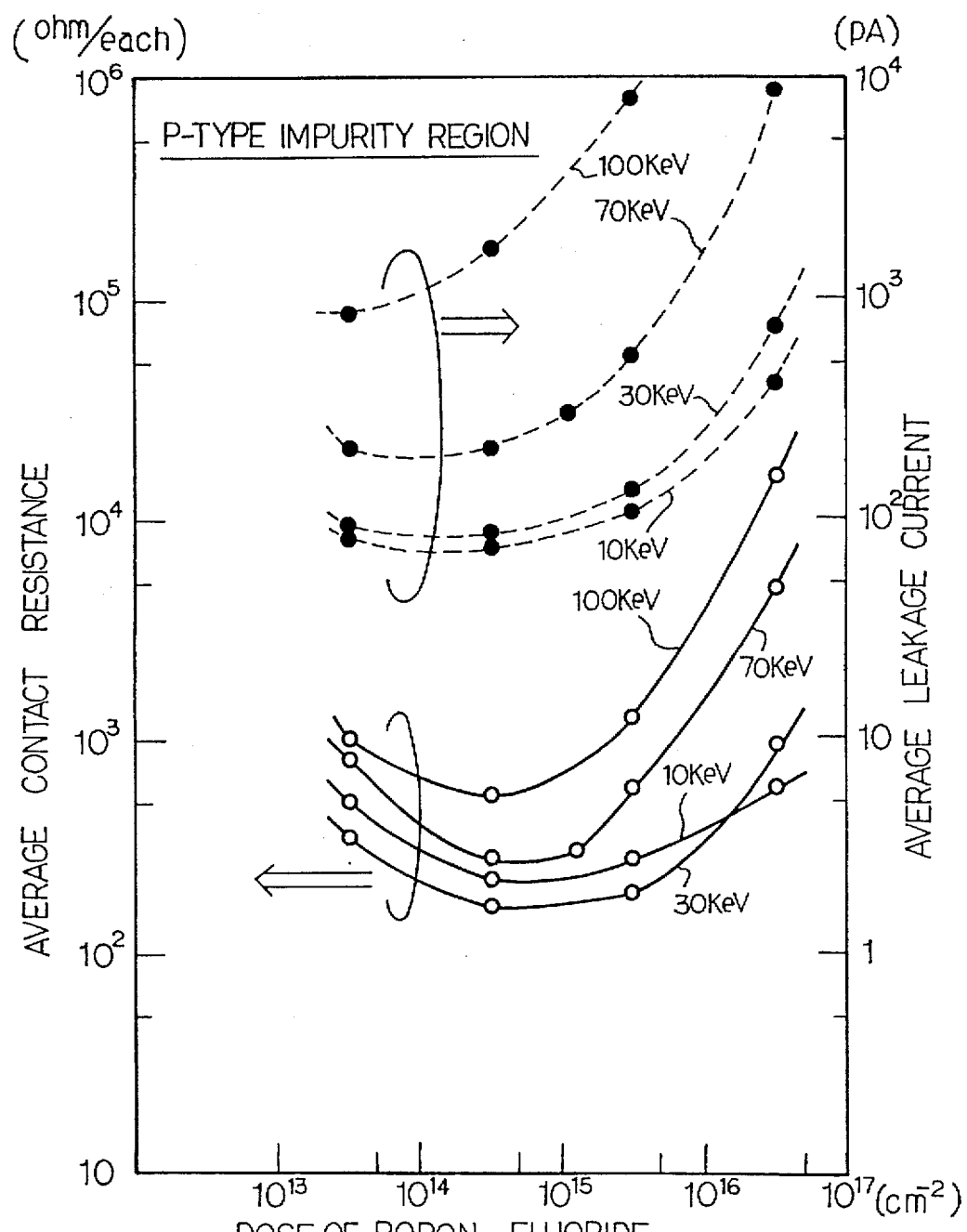
FIG. 8 is a graph showing the implanted ion dependency of a contact resistance and the dopant concentration dependency of leakage current for a contact open to a p-type impurity region.

FIGS. 7 and 8 illustrate the contact resistance and the leakage current measured in the contact holes 4d and 4e in terms of the dose at respective acceleration energy values.

N-type impurity regions were formed such that the p-n junction was 0.15 micron in depth, and were exposed to contact holes of 0.4 micron square. P-type impurity regions were also formed such that the p-n junction was 0.15 micron in depth, and were also exposed to contact holes of 0.4 micron square. The n-type impurity regions exposed to the contact holes and the p-type impurity regions exposed to the contact holes were covered with protective silicon oxide of 10 nanometers thick. Phosphorous was ion implanted through the contact holes into the n-type impurity regions, and boron fluoride ($BF_2$) was ion implanted through the contact holes into the p-type impurity regions. After the ion-implantation, the protective silicon oxide was removed.

Titanium was deposited on the n-type impurity regions and the p-type impurity regions exposed to the contact holes, and the titanium was converted to titanium silicide at 500 degrees centigrade for an hour.

The titanium silicide layers were applied with 5 volts, and the present inventor measured current. The average contact resistance was plotted as indicated by real lines, and the average leakage current was plotted as indicated by broken lines.

As will be understood from FIGS. 7 and 8, when the dose was increased to $10^{14}$ cm$^{-2}$, the contact resistance on the n-type impurity region was decreased. However, the contact resistance at the dose more $10^{15}$ cm$^{-2}$ was increased. This tendency became strong together with the increase of the acceleration energy.

On the other hand, the leakage current was increased together with the dose, and this tendency became strong when the acceleration energy was increased.

From FIG. 7, the present inventor determined recommendable ranges for the dose as follows.

When the acceleration energy is 10 KeV, the recommendable range has the lower limit equal to or greater than $10^{13}$ cm$^{-2}$ and the upper limit equal to or less than $10^{16}$ cm$^{-2}$.

When the acceleration energy is 30 KeV, the recommendable range has the lower limit equal to or greater than $10^{13}$ cm$^{-2}$ and the upper limit equal to or less than $10^{16}$ cm$^{-2}$.

When the acceleration energy is 70 KeV, the recommendable range has the lower limit equal to or greater than $10^{13}$ cm$^{-2}$ and the upper limit equal to or less than $4 \times 10^{15}$ cm$^{-2}$.

However, there is no recommendable range for the acceleration energy of 100 KeV.

The present inventor obtains the followings. First, when the projection range is represented by Rp, the implanted impurity amorphizes the silicon ranging from (3/4)Rp to (5/4)Rp.

Second, when the dose is small, the surface portion of the n-type impurity region is hardly amorphized under large acceleration energy, and the contact resistance becomes large.

Third, if the acceleration energy or the dose was large, the n-type ion-implanted sub-regions penetrates into the p-type silicon region beneath the n-type impurity region, and the junction of the n-type impurity region is hardly recrystallized through the silicidation. This results in large contact resistance and a large amount of leakage current. In other words, it is preferable that the implanted impurity does not project through the n-type impurity region.

When the arsenic was used as the implanted impurity, the recommendable range of the acceleration energy/dose became narrower than that of the phosphorous.

Although U.S. Pat. No. 5302549 sets a limit on the acceleration energy without discussion, the present inventor specified parameters affecting the recommendable range of the acceleration energy/dose. Typical parameters are thickness of the protective silicon oxide layer, the depth of the p-n junction of the n-type impurity region and the thickness of the titanium layer.

Turning to FIG. 8, when the dose was increased to 3 to $5 \times 10^{14}$ cm$^{-2}$ the contact resistance on the p-type impurity region was decreased. However, the contact resistance was increased thereafter. This tendency became strong together with the acceleration energy.

The amount of leakage current was increased together with the dose of the boron fluoride, and the tendency became strong when the acceleration energy was increased.

From FIG. 8, the present inventor determined recommendable ranges for the dose as follows.

When the acceleration energy is 10 KeV, the recommendable range has the lower limit equal to or greater than $3\times10^{13}$ cm$^{-2}$ and the upper limit equal to or less than $3\times10^{16}$ cm$^{-2}$.

When the acceleration energy is 30 KeV, the recommendable range has the lower limit equal to or greater than $3\times10^{13}$ cm$^{-2}$ and the upper limit equal to or less than $3\times10^{16}$ cm$^{-2}$.

When the acceleration energy is 70 KeV, the recommendable range has the lower limit equal to or greater than $3\times10^{13}$ cm$^{-2}$ and the upper limit equal to or less than $3\times10^{15}$ cm$^{-2}$.

When the acceleration energy is 100 KeV, the recommendable range has the lower limit equal to or greater than $3\times10^{13}$ cm$^{-2}$ and the upper limit equal to or less than $1\times10^{15}$ cm$^{-2}$.

It is also important for the p-type implanted impurity not to penetrate the p-type impurity region.

By the way, the contact resistance under the acceleration energy of 10 KeV is larger than the contact resistance under the acceleration energy of 30 KeV at the dose equal to or less than $10^{16}$ cm$^{-2}$. The reason for it is that the p-type ion-implanted sub-region under the acceleration energy of 10 KeV is much thinner than the titanium layer thereover.

The process of fabricating a dynamic random access memory device is simplified on the basis of the experimental results described hereinbefore.

When the protective silicon oxide layer 8 is deposited, phosphorous is ion implanted through the contact holes 4$d$ and 4$e$ without a patterned photo-resist layer at dose of $1\times10^{14}$ cm$^{-2}$ under 10 KeV, and n-type ion-implanted sub-regions are formed in both of the n-type/p-type drain regions 3$g$/3$j$. A photo-resist layer is patterned so as to cover the contact hole 4$d$, and boron fluoride is ion implanted through the contact hole 4$e$ into the p-type drain region 3$j$ at dose of $1\times10^{15}$ cm$^{-2}$ under 70 KeV by using the patterned photo-resist layer as a mask. The second ion-implantation is carried out under the acceleration energy larger than that of the first ion-implantation, and a p-type ion-implanted sub-region is formed in the p-type drain region 3$j$ instead of the n-type ion-implanted sub-region.

Alternatively, after the boron fluoride is ion implanted into the n-type/p-type drain regions 3$g$/3$j$ at dose of $1\times10^{14}$ cm$^{-2}$ under 30 KeV, a mask covers the contact hole 4$e$, and phosphorous is ion implanted through the contact hole 4$d$ into the n-type drain region 3$g$.

Although particular embodiments of the present invention have been shown and described, it will be obvious to those skilled in the art that various changes and modifications may be made without departing from the spirit and scope of the present invention.

What is claimed is:

1. A process of fabricating a semiconductor dynamic random access memory device, comprising the steps of:

a) preparing a semiconductor substrate including a first area assinged to a plurality of memory cells and a second area assigned to peripheral circuits, at least one complementary transistor being incorproated in said peripehral circuits;

b) fabricating switching transistors of said plurality of memory cells and said at least one complementary transistor on said semiconductor substrate;

c) covering said switching transistors and said at least on complementary transistor with a lower inter-level insulating structure having first contact holes exposing first impurity regions of said switching transistors;

d) fabricating storage capacitors having respective storage node electrodes respectively held in contact through said first contact holes with said first impurity regions, dielectric films of tantalum oxide covering said storage node electrodes and at least one cell plate electrode held in contact with said dielectric films so as to be opposed to said storage node electrodes; and e) covering said storage capacitors with an upper inter-level insulating structure having second contact holes exposing second impurity regions of said at least one complementary transistor by using a deposition technique carried out at a first temperature equal to or less than 530 degrees centigrade; and f) forming at least one interconnection on said upper inter-level insulating structure connected through said second contact holes with said second impurity regions by using techniques carried out at second temperatures not greater than 530 degrees centigrade.

2. The process as set forth in claim 1, in which said step f) includes the sub-steps of f-1) covering said second impurity regions with protective layers, f-2) ion implanting a dopant impurity of a first conductivity type and another dopant impurity of a second conductivity type opposite to said first conductivity type so as to form at least one first amorphous ion-implanted sub-region of said first conductivity type in one of said second impurity regions of said first conductivity type and at least one second amorphous ion-implanted sub-region of sid second conductivity type in another of said second impurity regions of said second conductivity type, f-3) removing said protective layers, f-4) covering said one of said second impurity regions and said another of said second impurity regions exposed to said second contact holes with first refractory metal layers, f-5) heating said first refractory metal layers to a temperature between 470 degrees centigrade and 530 degres centigrade in an inert atmosphere so as to convert at least parts of said first refractory metal layers into refractory metal silicide layers, and f-6) forming remaining parts of siad at least one interconnection.

3. The process as set forth in claim 2, in which said dopant impurity and said another dopant impurity are phosphorous and boron fluoride, respectively, said second impurity regions have respective p-n junctions around 0.15 microns in depth, said protective layers are 10 nanoters thick, and said first refractory metal layers are 40 to 50 nanometers thick;

said dopnat impurity being ion-implanted under the following conditions, when the acceleration energy is 10 KeV, a dose of said phosphorous has the lower limit equal to or greater than $10^{13}$ cm$^{-2}$ and the upper limit equal to or less than $10^{16}$ cm$^{-2}$;

when the acceleration energy is 30 KeV, said dose of said phosphorous has the lower limit equal to or greater than $10^{13}$ cm$^{-2}$ and the upper limit equal to or less than $10^{16}$ cm$^{-2}$; or when the acceleration energy is 70 KeV, said dose of said phosphorous has the lower limit equal to or greater than $10^{13}$ cm$^{-2}$ and the upper limit equal to or less than $4\times10^{15}$ cm$^{-2}$;

said another dopant impurity being ion implanted under the following conditions, when the acceleration energy is 10 KeV, a dose of said boron fluoride has the lower limit equal to or greater than $3\times10^{13}$ cm$^{-2}$ and the upper limit equal to or less than $3\times10^{16}$ cm$^{-2}$, when the acceleration energy is 30 KeV, said dose of said boron fluoride has the lower limit equal to or greater than $3\times10^{13}$ cm$^{-2}$ and the upper limit equal to or less than $3\times10^{16}$ cm$^{-2}$, when the acceleration energy is 70 KeV, said dose of said boron fluoride has the lower limit equal to or greater than $3\times10^{13}$ cm$^{-2}$ and the upper limit equal to or less than $3\times10^{15}$ cm$^{-2}$, or when the acceleration energy is 100 KeV, said dose of said boron fluoride has the lower limit equal to or greater than $3\times10^{13}$ cm$^{-2}$ and the upper limit equal to or less than $1\times10^{15}$ cm$^{-2}$.

4. The process as set forth in claim 2, in which said second impurity regions are formed of silicon, and said first refractory metal layers are formed of titanium.

5. The process as set forth in claim 2, in which said sub-step f-6) has the sub-steps of
   f-6-1) plugging said second contact holes with pieces of second refractory metal,
   f-6-2) depositing a conductive material layer on said upper inter-level insulating structure, and
   f-6-3) patterning said conductive material layer into a wiring.

6. The process as set forth in claim 1, in which said step c) includes the sub-steps of
   c-1) depositing a first non-doped silicon oxide layer over said switching transistors and said at least on complementary transistor through a low-pressure chemical vapor deposition in a first gaseous mixture containing tetraethylorthosilicate gas,
   c-2) smoothening an upper surface of said first non-doped silicon oxide layer where bit lines connected through selected ones of said first contact holes to said switching transistors extends for said switching transistors,
   c-3) depositing a second non-doped silicon oxide layer over said upper surface of said first non-doped silicon layer, and
   c-4) smoothening an upper surface of said second non-doped silicon oxide layer where said storage capacitors connected through others of said first contact holes to said switching transistors are formed.

7. The process as set forth in claim 6, in which one of an etch-back and a chemical-mechanical polishing is used in said sub-steps c-2) and c-4).

8. The process as set forth in claim 1, in which said step d) includes the sub-steps of
   d-1) forming said storage node electrodes on said upper surface of said lower inter-level insulating structure,
   d-2) depositing a tantalum oxide layer on said storage node electrodes by using an reaction of ethoxy tantalum with oxygen around 450 degrees centigrade,
   d-3) depositing a titanium nitride layer on said tantalum oxide layer by using a reactive sputtering,
   d-4) depositing tungsten silicide layer on said titanium nitride layer by using a sputtering, and
   d-5) patterning said tungsten silicide layer, said titanium nitride layer and said tantalum oxide layer into said dielectric films of said tantalum oxide and said at least one cell plate electrode.

9. The process as set forth in claim 1, in which said step e) includes the sub-steps of
   e-1) depositing a first non-doped silicon oxide layer over said storage capacitors and said lower inter-level insulating structure by using a plasma-exited chemical vapor deposition at a temperature lower than 500 degrees centigrade,
   e-2) coating said first non-doped silicon oxide layer with a spin-on-glass layer of silicon oxide,
   e-3) baking said spin-on-glass layer around 400 degrees centigrade, and
   e-4) depositing a second non-doped silicon oxide layer over said spin-on-glass layer by using said plasma-exited chemical vapor deposition at a temperature lower than 500 degrees centigrade.

10. The process as set forth in claim 9, said step e) further including the sub-step of smoothening an upper surface of said spin-on-glass layer between said sub-step e-3) and said sub-step e-4).

* * * * *